(12) United States Patent
Lee

(10) Patent No.: US 7,301,842 B2
(45) Date of Patent: Nov. 27, 2007

(54) SYNCHRONOUS PSEUDO STATIC RANDOM ACCESS MEMORY

(75) Inventor: Yin-Jae Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 163 days.

(21) Appl. No.: 11/326,177

(22) Filed: Dec. 30, 2005

(65) Prior Publication Data

US 2007/0002651 A1     Jan. 4, 2007

(30) Foreign Application Priority Data

Jun. 30, 2005     (KR) .................. 10-2005-0058521

(51) Int. Cl.
*G11C 7/00* (2006.01)
(52) U.S. Cl. ..................... 365/222; 365/203
(58) Field of Classification Search ................ 365/222, 365/203, 233, 230.06
See application file for complete search history.

(56) References Cited

U.S. PATENT DOCUMENTS

| | | | |
|---|---|---|---|
| 5,835,956 A * | 11/1998 | Park et al. .................. 711/167 |
| 5,903,916 A | 5/1999 | Pawlaowski et al. |
| 6,711,083 B2 * | 3/2004 | Demone ...................... 365/222 |
| 6,853,602 B2 | 2/2005 | Huang |
| 6,891,772 B2 | 5/2005 | Demone |
| 7,042,777 B2 * | 5/2006 | Oh .............................. 365/194 |

FOREIGN PATENT DOCUMENTS

| | | |
|---|---|---|
| JP | 2002-230973 | 8/2002 |
| JP | 2004-318500 | 11/2004 |

\* cited by examiner

*Primary Examiner*—Anh Phung
(74) *Attorney, Agent, or Firm*—Blakely, Sokoloff, Taylor & Zafman

(57) ABSTRACT

A latency control circuit for use in a semiconductor memory device includes a precharge unit for outputting a precharge reset signal based on a refresh signal and a normal active signal, wherein the precharge reset signal is used for extending a latency during a burst read period which includes a refresh cycle; a refresh cycle detector for detecting the refresh cycle in response to a latency setting signal and the precharge reset signal to thereby output a latency extension signal; a latency decoder for decoding an external address to thereby output a plurality of preliminary latency signals; and a latency controller for outputting a plurality of latency signals in response to the preliminary latency signal and the latency extension signal.

15 Claims, 8 Drawing Sheets

SYNCHRONOUS PSEUDO STATIC RANDOM ACCESS MEMORY

FIELD OF THE INVENTION

The present invention relates to a synchronous pseudo random access memory (PSRAM); and, more particularly, to a synchronous PSRAM for improving an operation efficiency by varying the latency according to the refresh operation.

DESCRIPTION OF RELATED ARTS

Generally, a semiconductor memory device includes a plurality of memory cells, a plurality of sense amplifiers for driving the memory cells, a row decoder, and a column decoder. A data stored in a predetermined memory cell is selected by using the row decoder and the column decoder and, then, amplified by the sense amplifier.

The memory cell of a dynamic random access memory (DRAM) is provided with one cell transistor performing a switching operation and one capacitor storing the data. Meanwhile, the data stored in the capacitor is discharged because of a leakage current occurring at a PN junction of the cell transistor. Therefore, a refresh operation is performed to thereby maintain the original data level by recharging the capacitor.

The refresh operation is similar to a read/write operation of the DRAM. That is, the refresh operation is performed by amplifying the data stored in the memory cell and, then, restoring the data into the memory cell.

Meanwhile, in order to decrease a current consumption and a size of a processing system using a memory device, it is required to reduce a size of the memory device and, accordingly, a capacitance of the capacitance. In this case, the refresh operation should be performed more frequently to maintain the data. However, when a refresh period becomes smaller, the performance degradation of the memory device occurs because an external device is not able to access to the memory device while the refresh operation is performed.

Further, when the refresh operation is performed more frequently, the current consumption for the refresh operation is increased.

To solve abovementioned problems related to the refresh operation, a pseudo static random access memory PSRAM is used. The PSRAM is a kind of DRAM which is operated like an SRAM. The PSRAM continuously performs a usual read/write operation and a refresh operation during one memory access cycle. Therefore, the PSRAM can be operated just like the SRAM though it is a DRAM actually.

Generally, the PSRAM performs a paging operation asynchronously. In case of a cycle that the paging operation is performed, a normal address for enabling a corresponding word line is activated and, then, after a predetermined time, i.e., a memory access time tRC, a page address for enabling a corresponding page is activated. The memory access time tRC includes an address active cycle for a read/write operation and a cell refresh cycle for the refresh operation. The memory access time tRC usually is about 75 ns to about 80 ns.

Meanwhile, a synchronous PSRAM has an initial latency in order to obtain the memory access time tRC. The initial latency corresponds to the number of clocks from a timing of starting a burst operation to a timing of outputting a data.

FIG. 1 is block diagram showing a conventional latency control circuit for use in a conventional PSRAM.

As shown, the conventional latency control circuit includes a latency decoder 1. The latency decoder 1 decodes a latency set signal BCR<13:11> and outputs a fixed latency signal LT<2:6> determining a latency of a fixed length. Herein, the latency set signal BCR<13:11> generated based on an external address A<13:11> sets a mode register in order to determine the latency length.

FIG. 2 is a timing diagram demonstrating a read operation of the conventional PSRAM.

Because of the fixed latency signal LT<2:6>, the initial latency is always fixed. For example, when a clock period CLK is about 20 ns and the memory access time tRC is about 70 ns, the initial latency is fixed to 4. Further, when the memory access time tRC is about 85 ns, the initial latency is fixed to 5.

Further, the synchronous PSRAM includes a wait pin WAIT monitoring an input/output timing of a valid data in order to reduce a data collision. Therefore, an external system transmits the data in response to a signal outputted from the wait pin WAIT.

Meanwhile, the refresh operation is not performed for every memory access cycle but performed for a predetermined period. Nevertheless, the conventional PSRAM always includes a latency for the refresh operation because the initial latency is fixed. Therefore, an operation performance of the conventional PSRAM is degraded.

SUMMARY OF THE INVENTION

It is, therefore, an object of the present invention to provide a latency control circuit for use in a synchronous PSRAM for improving an operation efficiency.

In accordance with an aspect of the present invention, there is provided a latency control circuit for use in a semiconductor memory device including: a precharge unit for outputting a precharge reset signal based on a refresh signal and a normal active signal, wherein the precharge reset signal is used for extending a latency during a burst read period which includes a refresh cycle; a refresh cycle detector for detecting the refresh cycle in response to a latency setting signal and the precharge reset signal to thereby output a latency extension signal; a latency decoder for decoding an external address to thereby output a plurality of preliminary latency signals; and a latency controller for outputting a plurality of latency signals in response to the preliminary latency signal and the latency extension signal.

BRIEF DESCRIPTION OF THE DRAWINGS

The above and other objects and features of the present invention will become apparent from the following description of embodiments taken in conjunction with the accompanying drawings, in which.

DETAILED DESCRIPTION OF THE INVENTION

Hereinafter, a latency control circuit for use in a synchronous pseudo static random access memory (PSRAM) in accordance with the present invention will be described in detail referring to the accompanying drawings.

Figure 1:
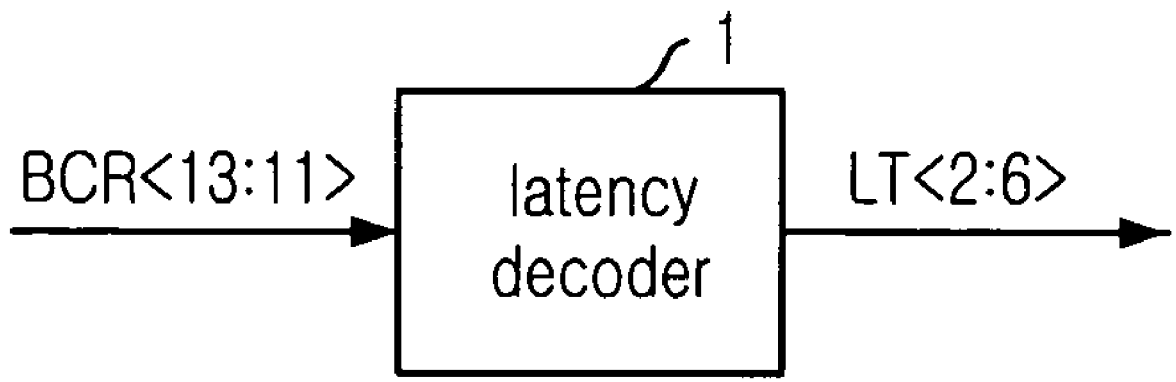
FIG. 1 is block diagram showing a conventional latency control circuit for use in a conventional PSRAM.
Figure 2:
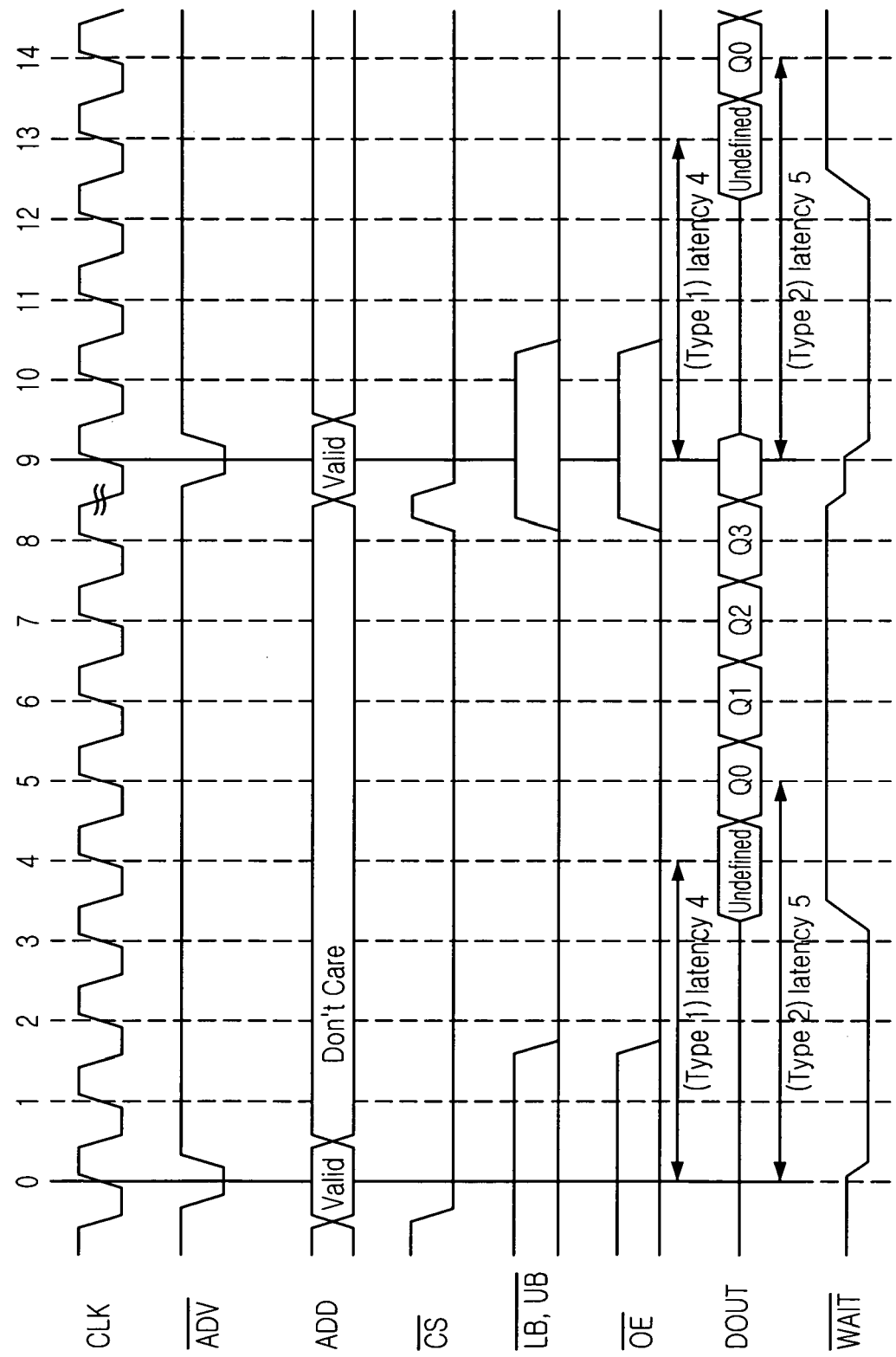
FIG. 2 is a timing diagram demonstrating a read operation of the conventional PSRAM.
Figure 3:
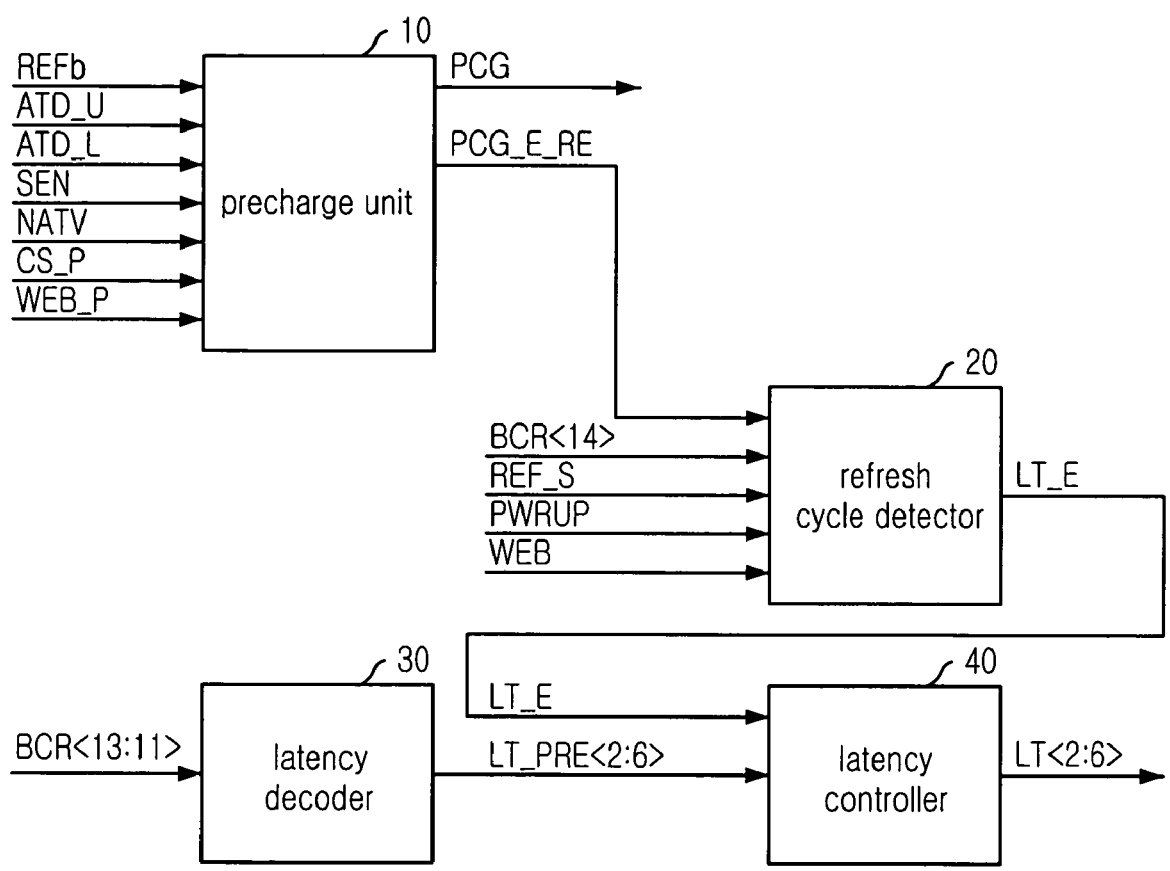
FIG. 3 is a block diagram describing the latency control circuit for use in a synchronous PSRAM in accordance with a embodiment of the present invention.

FIG. 3 is a block diagram describing the latency control circuit for use in a synchronous PSRAM in accordance with an embodiment of the present invention.

As shown, the latency control circuit includes a precharge unit 10, a refresh cycle detector 20, a latency decoder 30, and a latency controller 40.

The precharge unit 10 receives a refresh signal REFb, an upper and a lower address detection signals ATD_U and ATD_L, a sense signal SEN, a normal active signal NATV, a chip selection signal CS_P, and a first write enable signal WEB_P to thereby output a precharge signal PCG and a precharge reset signal PCG_E_RE. Herein, the chip selection signal CS_P is activated as a logic high level and the write enable signal WEB_P is pulse signal generated when a write enable pin /WE transit from a logic low level to a logic high level.

The refresh cycle detector 20 detects a refresh cycle based on the precharge reset signal PCG_E_RE, a latency setting signal BCR<14>, a refresh start signal REF_S, a power-up signal PWRUP, and a second write enable signal WEB to thereby output a latency extension signal LT_E. Herein, the latency setting signal BCR<14> corresponding to an address A14 is a mode register set (MRS) signal for a read operation and determines a latency length.

The refresh cycle detector 20 outputs the latency extension signal LT_E of a logic high level during a burst read period which including the refresh cycle and outputs the latency extension signal LT_E of a logic low level after the precharge reset signal, which denotes a termination of the burst read period, is activated.

The latency decoder 30 decodes a latency setting signal BCR<13:11> to output a preliminary latency signal LT_PRE<2:6>. Herein, the latency setting signal BCR<13:11> is generated based on external addresses A11 to A13.

The latency controller 40 selectively activates a latency signal LT<2:6> based on the latency extension signal LT_E and the preliminary latency signal LT_PRE<2:6> in order to determine a latency length. That is, the latency controller 40 outputs the first or the second latency signal LT<2> and LT<3> during the burst read period which does not include the refresh cycle and outputs the third or the fourth latency signal LT<4> and LT<6> during the burst read period which includes the refresh cycle. Therefore, it is possible for the present invention to have latency of various lengths.

Figure 4:
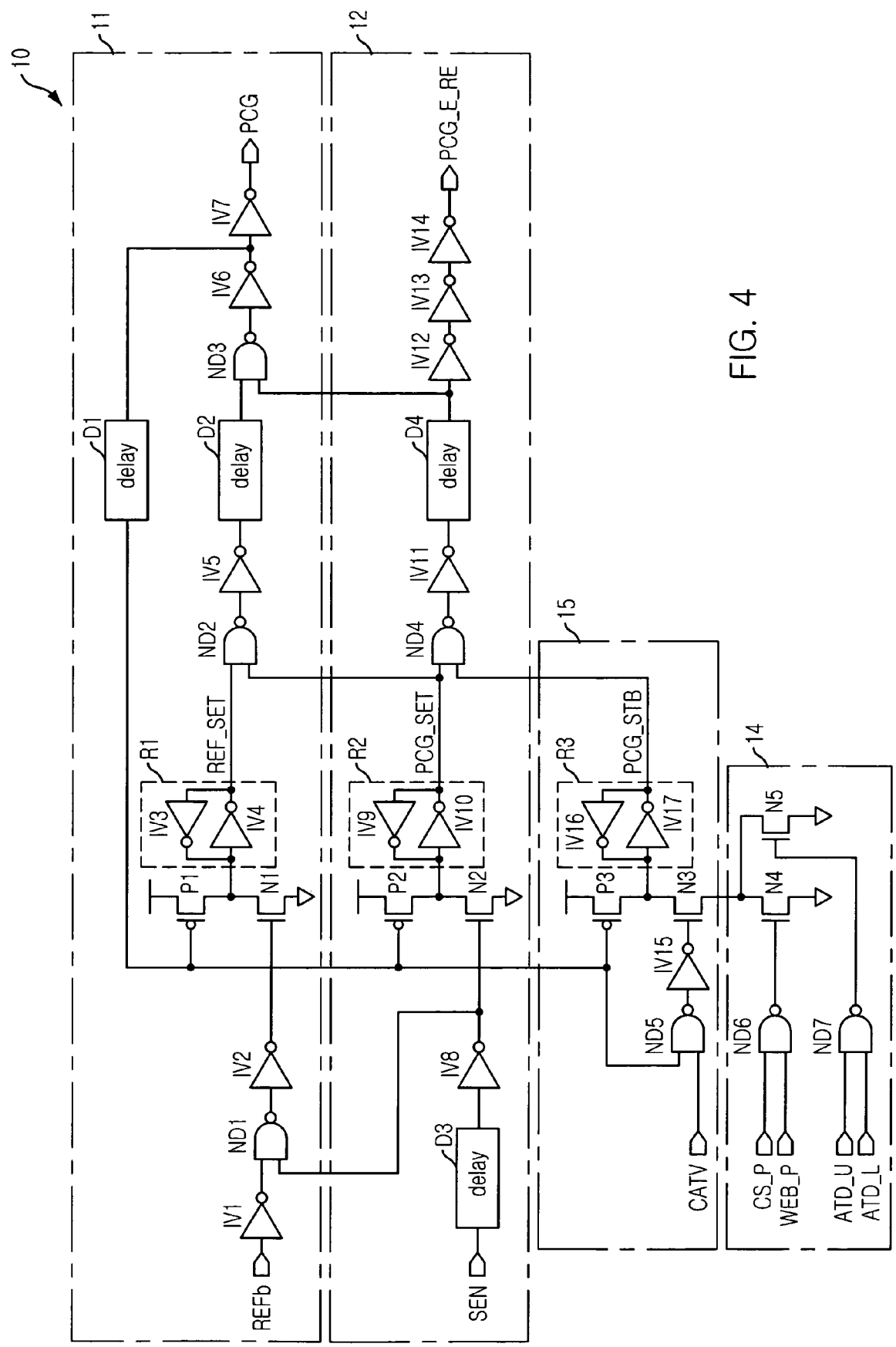
FIG. 4 is a schematic circuit diagram depicting a precharge unit shown in FIG. 3.

FIG. 4 is a schematic circuit diagram depicting the precharge unit 10 shown in FIG. 3.

The precharge unit 10 contains a precharge signal generator 11, a precharge reset signal generator 12, and a first and a second drivers 13 and 14.

The precharge signal generator 11 is implemented with a plurality of inverters IV1 to IV7, a plurality of NAND gates ND1 to ND3, a first PMOS transistor P1, a first NMOS transistor N1, and a first and a second delays D1 and D2.

The first NAND gate ND1 receives an inverted refresh signal REFb inverted by the first inverter IV1 and a delayed sense signal SEN. The first driver voltage generator provided with a first PMOS transistor P1 and the first NMOS transistor N1 transmits a first drive voltage to a first latch R1 in response to outputs of the first delay D1 and the second inverter IV2. The first latch R1 provided with the third and the fourth inverters IV3 and IV4 latches the first drive voltage from a common node of the first PMOS transistor P1 and the first NMOS transistor N1 and outputs a refresh set signal REF_SET.

Further, the second NAND gate ND2 receives the refresh set signal REF_SET and a precharge set signal PCG_SET outputted from the precharge reset signal generator 12. The fifth inverter IV5 inverts an output of the second NAND gate ND2. The second delay D2 delays an output of the fifth inverter IV5 for a predetermined time. The third NAND gate ND3 receives outputs of the second and a fourth delays D2 and D4. The sixth inverter IV6 inverts an output of the third NAND gate ND3 and outputs to the first delay D1. The seventh inverter IV7 inverts the output of the sixth inverter IV6 to thereby output the precharge signal PCG.

The precharge reset signal generator 12 includes a plurality of inverters IV8 to IV14, a fourth NAND gate ND4, a second PMOS transistor P2, a second NMOS transistor N2, and two delays D3 and D4.

The third delay D3 delays the sense signal SEN for a predetermined time. The eighth inverter IV8 inverts and outputs the delayed sense signal SEN to the first NAND gate ND1 in the precharge signal generator 11. The second driver voltage generator provided with a second PMOS transistor P2 and the second NMOS transistor N2 transmits a second drive voltage to a second latch R2 in response to outputs of the first delay D1 and the eighth inverter IV8. The second latch R2 provided with the ninth and the tenth inverters IV9 and IV10 latches the second drive voltage from a common node of the second PMOS transistor P2 and the second NMOS transistor N2 to thereby output the precharge set signal PCG_SET.

The fourth NAND gate ND4 receives the precharge set signal PCG_SET and a precharge wait signal PCG_STB outputted from the first driver 13. The eleventh inverter IV11 inverts an output of the fourth NAND gate ND4. The fourth delay D4 delays an output of the eleventh inverter IV11 for a predetermined time. The output of the fourth delay D4 is outputted to the third NAND gate ND3 of the precharge signal generator 11. The three inverters IV12 to IV14 invert and delay the output of the fourth delay D4 to thereby output the precharge reset signal PCG_E_RE.

The first driver 13 includes a plurality of inverters IV15 to IV17, a fifth NAND gate ND5, a third PMOS transistor P3, and a third NMOS transistor N3.

The fifth NAND gate ND5 receives the output of the first delay D1 and the normal active signal NATV. The third driver voltage generator provided with a third PMOS transistor P3 and the third NMOS transistor N3 transmits a third drive voltage to a third latch R3 in response to outputs of the first delay D1 and the fifteenth inverter IV15. The third latch R3 provided with the sixteenth and the seventeenth inverters IV16 and IV17 latches the third drive voltage from a common node of the third PMOS transistor P3 and the third NMOS transistor N3 to thereby output the precharge wait signal PCG_STB.

The second driver 14 includes two NAND gates ND6 and ND7 and two NMOS transistors N4 and N5.

The sixth NAND gate ND6 receives the chip selection signal CS_P and the first write enable signal WEB_P. The seventh NAND gate ND7 receives the upper and the lower address detection signals ATD_U and ATD_L for detecting a transition of the normal address signal NATV. The fourth and the fifth NMOS transistors N4 and N5 transmit a ground voltage VSS to the third NMOS transistor N3 in response to outputs of the sixth and the seventh NAND gates ND6 and ND7, respectively.

Figure 5:
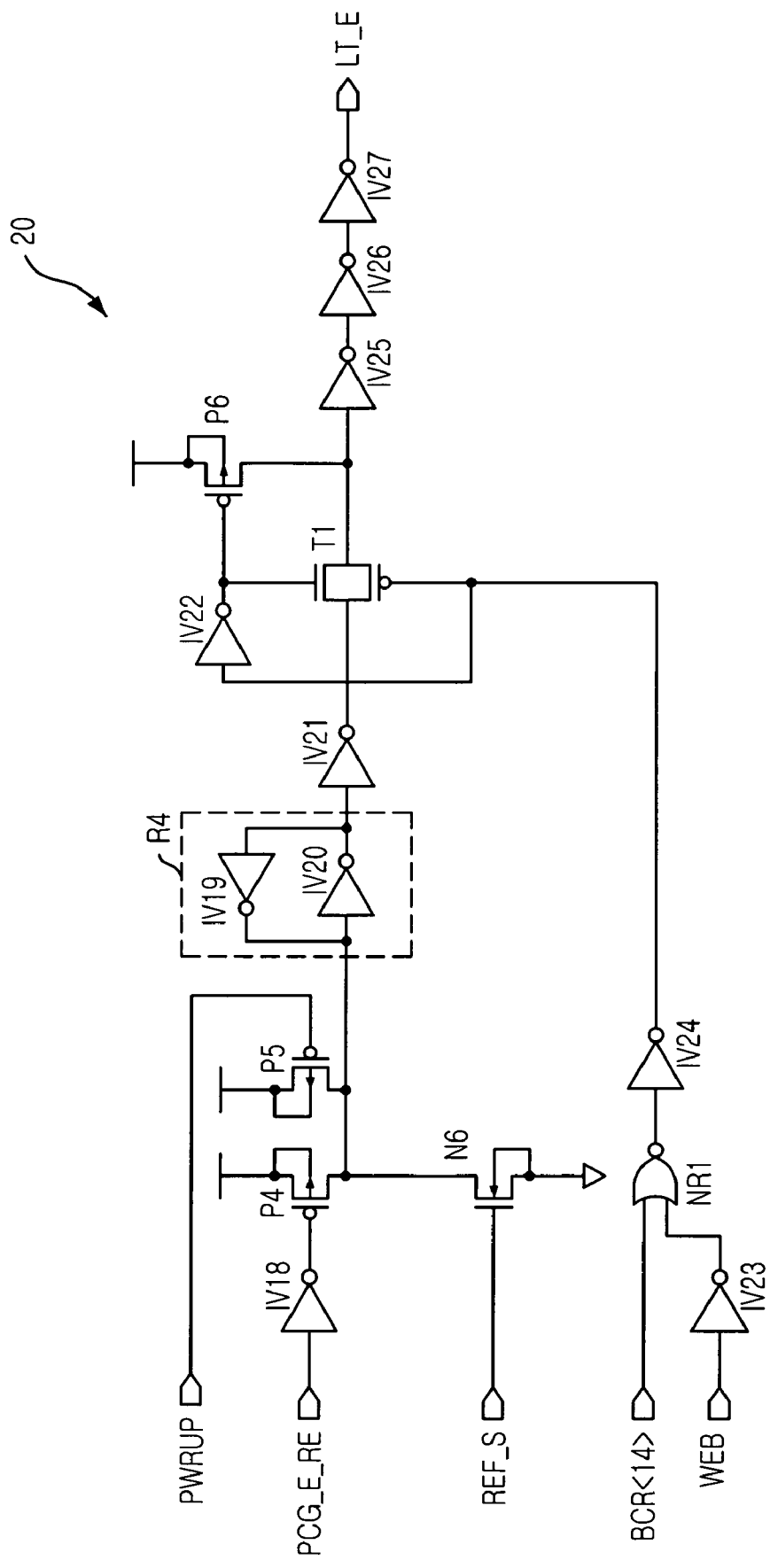
FIG. 5 is a schematic circuit diagram describing a refresh cycle detector shown in FIG. 3.

FIG. 5 is a schematic circuit diagram describing the refresh cycle detector 20 shown in FIG. 3.

As described in FIG. 5, the refresh cycle detector 20 includes a plurality of inverters IV18 to IV27, three PMOS transistors P4 to P6, a sixth NMOS transistor N6, a transmission gate T1, and a NOR gate NR1.

The fourth and the fifth PMOS transistor P4 and P5 parallel connected to each other respectively controlled by an inverted precharge reset signal PCG_E_RE and the power-up signal PWRUP. The fourth latch R4 provided with two inverters IV19 and IV20 latches a voltage loaded at a common node of the fourth and the fifth PMOS transistors P4 and P5 and the sixth NMOS transistor N6. The sixth NMOS transistor N6 is controlled by the refresh start signal REF_S which has information about a start timing of the refresh operation. The NOR gate NR1 receives the latency setting signal BCR<14> and an inverted write enable signal WEB. The twenty fourth inverter IV24 inverts an output of the NOR gate NR1.

Further, the transmission gate T1 transmits an output of the twenty first IV21 in response to outputs of the inverters IV22 and IV24. The sixth PMOS transistor P6 connected to the power supply voltage VDD terminal provides the transmission gate T1 with the power supply voltage VDD in order to precharge an output node of the transmission gate T1. The inverters IV25 to IV27 inverts and delays an output of the transmission gate T1 to thereby output the latency extension signal LT_E.

Figure 6:
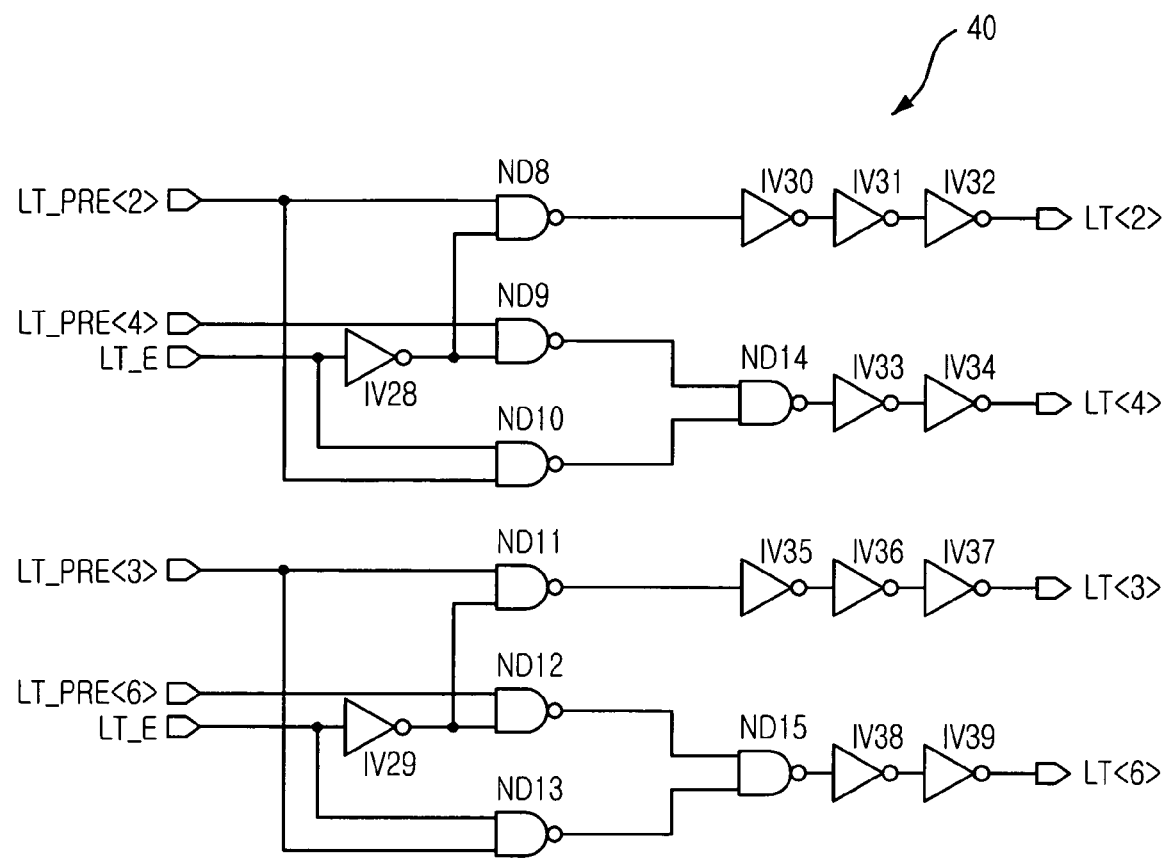
FIG. 6 is a schematic circuit diagram showing a latency controller shown in FIG. 3.

FIG. 6 is a schematic circuit diagram showing the latency controller 40 shown in FIG. 3.

The latency controller 40 includes a plurality of NAND gates ND8 to ND15 and a plurality of inverters IV28 to IV30.

The eighth NAND gate ND8 receives the first preliminary latency signal LT_PRE<2> and an inverted latency extension signal LT_E inverted by the twenty eighth inverter IV28. The inverters IV30 to IV32 invert and delay an output of the eighth NAND gate ND8 to thereby output the first latency signal LT<2>.

The ninth NAND gate ND9 receives the third preliminary latency signal LT_PRE<4> and the inverted latency extension signal LT_E. The tenth NAND gate ND10 receives the first preliminary latency signal LT_PRE<2> and the latency extension signal LT_E. The fourteenth NAND gate ND14 receives outputs of the ninth and the tenth NAND gates ND9 and ND10. The inverters IV33 and IV34 delay an output of the fourteenth NAND gate ND14 to thereby output the third latency signal LT<4>.

The eleventh NAND gate ND11 receives the second preliminary latency signal LT_PRE<3> and an inverted latency extension signal LT_E inverted by the twenty ninth inverter IV29. The inverters IV35 to IV37 invert and delay an output of the eleventh NAND gate ND11 to thereby output the second latency signal LT<3>.

The twelfth NAND gate ND12 receives the fourth preliminary latency signal LT_PRE<6> and the inverted latency extension signal LT_E. The thirteenth NAND gate ND13 receives the second preliminary latency signal LT_PRE<3> and the latency extension signal LT_E. The fifteenth NAND gate ND15 receives outputs of the twelfth and the thirteenth NAND gates ND12 and ND13. The inverters IV38 and IV39 delay an output of the fifteenth NAND gate ND15 to thereby output the fourth latency signal LT<6>.

Figure 7:
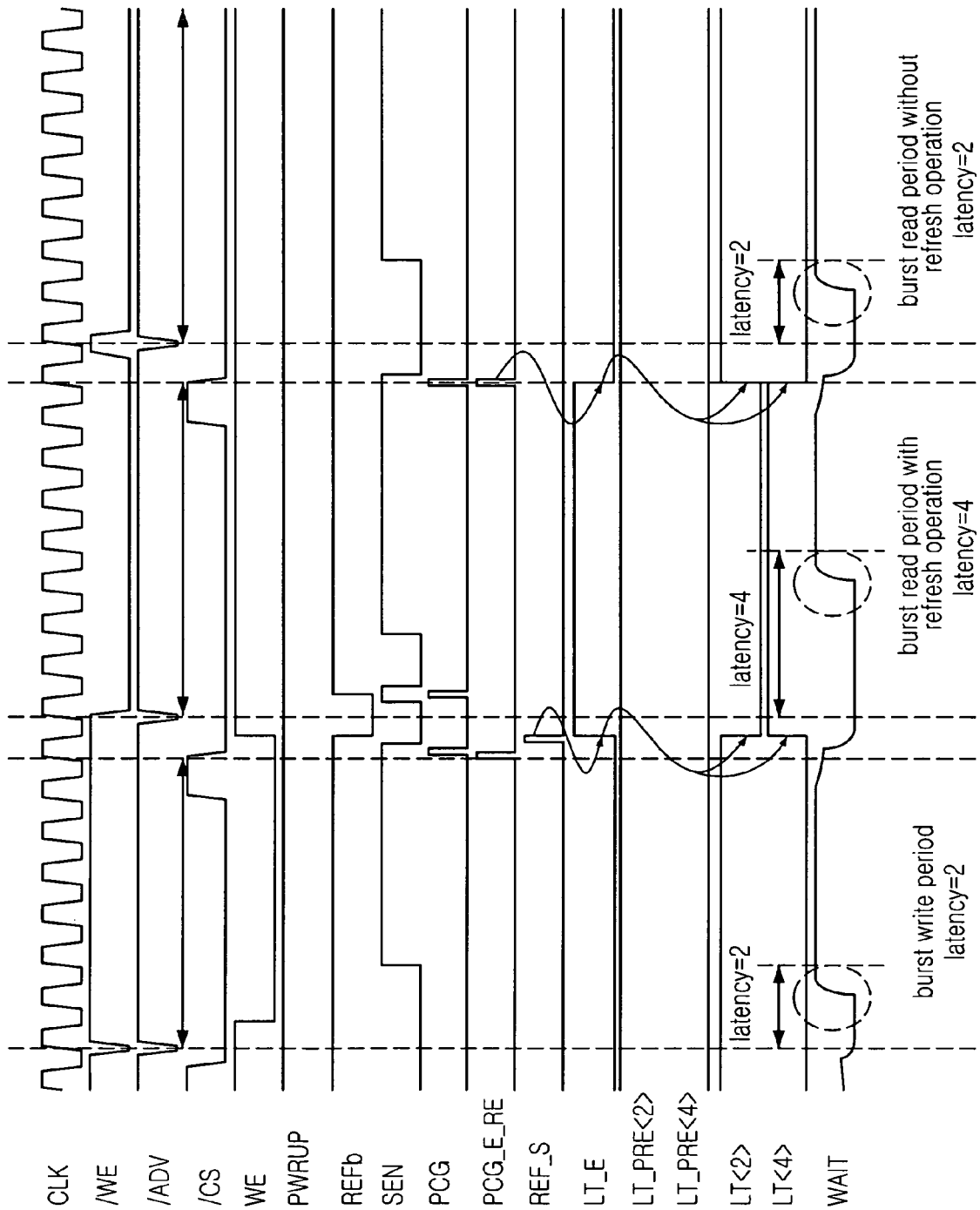
FIG. 7 is a timing diagram demonstrating an operation of the latency control circuit of the present invention shown in FIG. 3.

FIG. 7 is a timing diagram demonstrating an operation of the latency control circuit of the present invention shown in FIG. 3.

In FIG. 7, a length of a normal latency is 2 and a length of a refresh latency is 4 in response to the first and the third latency signals LT<2> and LT<4>. The normal latency and the refresh latency refer to latencies which are occurred during burst read period which does not include the refresh cycle and during burst read period which includes the refresh cycle.

In order to start the read operation, the precharge signal generator 10 outputs the precharge wait signal PCG_STB in response to activations of the normal active signal NATV, the chip selection signal CS_P, the write enable signal WEB_P, the upper and the lower address detection signals ATD_U and ATD_L.

Herein, the normal active signal NATV is activated as a logic high level in response to an activation of an external active signal and deactivated as a logic low level when the precharge signal PCG becomes a logic high level. The chip selection signal CS_P is activated when an external chip selection signal /CS becomes a logic high level. The write enable signal WEB_P is activated when an external write signal /WE becomes a logic high level. Further, the upper and the lower address detection signals ATD_U and ATD_L are activated in response to an address transition.

Then, after a data is loaded to a bit line, the sense signal SEN which shows that a sense amplifier is finishes its operation is activated. The precharge set signal PCG_SET is activated as a logic high level in response to an activation of the sense signal SEN. The precharge signal PCG becomes a logic high level in response to the precharge set signal PCG_SET and the precharge wait signal PCG_STB of logic high levels. The refresh signal REFb maintains a logic high level during a read/write operation.

Meanwhile, the refresh signal REFb is activated as a logic low level and the precharge reset signal generator 12 activates the precharge reset signal PCG_E_RE during the refresh operation. Accordingly, the latency extension signal LT_E maintains an activation state during a time from starting the burst read period which includes the refresh cycle to activating the precharge reset signal.

The transmission gate T1 in the refresh cycle detector 20 is turned off when the latency setting signal BCR<14> is a logic high level or when the latency setting signal BCR<14> is a logic low level and the external write enable signal /WE is a logic low level. In this case, sixth PMOS transistor P6 is turned on to thereby output the latency extension signal LT_E of a logic low level.

On the other hand, the transmission gate T1 is turned on during a burst read period where the latency setting signal BCR<14> is a logic low level and the external write enable signal /WE is a logic high level. Then, when the refresh start signal REF_S is enabled, the latency extension signal LT_E becomes a logic high level.

The latency controller 40 extends the latency for predetermined clocks in response to the latency extension signal LT_E during the burst read period which includes the refresh cycle.

In detail, when the latency extension signal LT_E is a logic low level, the latency controller 40 outputs the preliminary latency signals LT_PRE<2> and LT_PRE<4> as the latency signals LT<2> and LT<4>. That is, the first latency signal LT<2> has a logic high level and the third latency signal LT<4> has a logic low level. Therefore, the latency becomes 2 during burst read period which does not include the refresh cycle.

On the other hand, when the latency extension signal LT_E is a logic high level, the latency controller 40 outputs the first latency signal LT<2> of a logic low level and the third latency signal LT<4> of a logic high level. Therefore, the latency becomes 4 during burst read period which includes the refresh cycle.

As a result, the latency control circuit according to abovementioned mentioned embodiment of the present invention controls the latency length in response to the latency extension signal LT_E in order to improve an operation speed.

Figure 8:
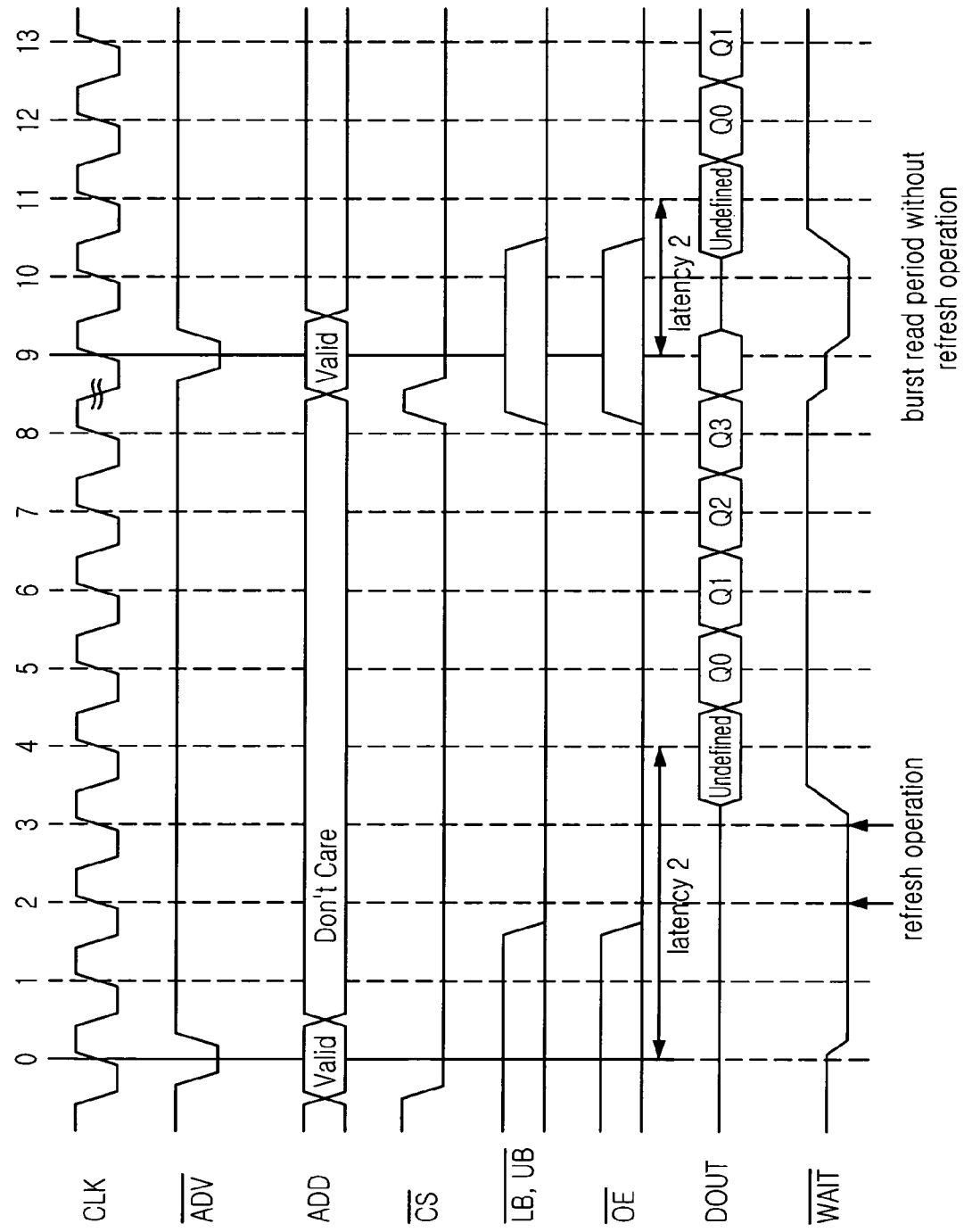
FIG. 8 is a timing diagram describing a burst read operation of the synchronous PSRAM including the latency control circuit shown in FIG. 3.

FIG. 8 is a timing diagram describing a burst read operation of the synchronous PSRAM including the latency control circuit shown in FIG. 3.

As shown, the latency in case of the burst read period which does not include the refresh cycle is set 2 of about 40 ns to about 45 ns. Also, the latency in case of the burst read period which includes the refresh cycle is set 4 of about 70 ns to about 85 ns.

As above described, the latency control circuit according to abovementioned mentioned embodiment of the present invention improves an operation efficiency by varying the latency according to the refresh operation.

The present application contains subject matter related to Korean patent application No. 2005-58521, filed in the Korean Patent Office on Jun. 30, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A latency control circuit for use in a semiconductor memory device, comprising:
   a precharge unit for outputting a precharge reset signal based on a refresh signal and a normal active signal, wherein the precharge reset signal is used for extending a latency during a burst read period which includes a refresh cycle;
   a refresh cycle detector for detecting the refresh cycle in response to a latency setting signal and the precharge reset signal to thereby output a latency extension signal;
   a latency decoder for decoding an external address to thereby output a plurality of preliminary latency signals; and
   a latency controller for outputting a plurality of latency signals in response to the preliminary latency signal and the latency extension signal.

2. The latency control circuit as recited in claim 1, wherein, if the refresh signal is activated, the precharge unit disables the precharge reset signal from a starting time of the burst read period to a precharge signal activated so as to maintain the activation of the latency extension signal during the burst read period.

3. The latency control circuit as recited in claim 2, wherein the precharge unit includes:
   a precharge signal generator for logically combining the refresh signal and a delayed sense signal to thereby output the precharge signal;
   a precharge reset signal generator for logically combining a sense signal and a precharge wait signal to output the precharge reset signal;
   a first drive unit for proving a first voltage based on a chip selection signal, a write enable signal, and an address detection signal; and
   a second drive unit for latching the first voltage in response to the normal active signal to thereby output the precharge wait signal.

4. The latency control circuit as recited in claim 3, wherein the first drive unit includes:
   a first logic unit for logically combining the chip selection signal, the write enable signal, and the address detection signal; and
   a first voltage driver for providing the first voltage with a ground voltage in response to an output of the first logic unit.

5. The latency control circuit as recited in claim 4, wherein the second drive unit includes:
   a second logic unit for logically combining the normal active signal and an inverted precharge signal;
   a second voltage driver for outputting a first drive voltage in response to an output of the second logic unit and the inverted precharge signal; and
   a first latch for latching the first drive voltage to output the precharge wait signal.

6. The latency control circuit as recited in claim 5, wherein the precharge reset signal generator includes:
   a first delay for delaying the sense signal to thereby output the delayed sense signal;
   a third voltage driver for selectively outputting a second drive voltage in response to an output of the first delay;
   a second latch for latching the second drive voltage to thereby output a precharge set signal;
   a third logic unit for logically combining the precharge set signal and the precharge wait signal; and
   a second delay for delaying an output of the third logic unit to thereby output the precharge reset signal.

7. The latency control circuit as recited in claim 6, wherein the precharge signal generator includes:
   a fourth logic unit for logically combining the refresh signal and the delayed sense signal;
   a fourth voltage driver for selectively outputting a third drive voltage in response to an output of the fourth logic unit;
   a third latch for latching the third drive voltage to thereby output a refresh set signal;
   a fifth logic unit for logically combining the refresh set signal and the precharge set signal; and
   a sixth logic unit for logically combining an output of the fifth logic unit and an inverted precharge reset signal.

8. The latency control circuit as recited in claim 1, wherein the refresh cycle detector activates the latency extension signal during the burst read period and deactivates the latency extension signal after the precharge reset signal denoting a termination of the burst read period is activated.

9. The latency control circuit as recited in claim 8, wherein the refresh cycle detector includes:
   a logic unit for logically combining the latency setting signal and a write enable signal; and
   a driving unit for latching and delaying the precharge reset signal to thereby output the latency extension signal in response to an output of the logic unit.

10. The latency control circuit as recited in claim 9, wherein the logic unit includes:
    a NOR gate to receive the latency setting signal and an inverted write enable signal; and
    an inverter for inverting an output of the NOR gate.

11. The latency control circuit as recited in claim 9, wherein the driving unit includes:

a first voltage driver for providing a power supply voltage to a common node in response to the precharge reset signal;

a second voltage driver for providing a ground voltage to the common node in response to a refresh start signal;

a latch for latching a voltage loaded at the common node of the first and the second voltage drivers;

a transmission gate for transmitting an output of the latch in response to the output of the logic unit;

a third voltage driver for precharging an output node of the transmission gate with the power supply voltage in response to the output of the sixth logic unit; and a delaying unit for delaying an output of the transmission gate to thereby output the latency extension signal.

12. The latency control circuit as recited in claim 1, wherein the latency controller outputs a preliminary latency signal as a corresponding latency signal when the latency extension signal is deactivated while outputting an inverted signal of the preliminary latency signal as the corresponding latency signal when the latency extension signal is activated.

13. The latency control circuit as recited in claim 12, wherein the latency controller includes:

a first latency signal generator for receiving a first and a second preliminary latency signal among the plurality of the preliminary latency signals and the latency extension signal to thereby output a first and a second latency signal among the plurality of the latency signals; and a second latency signal generator for receiving a third and a fourth preliminary latency signals and the latency extension signal to thereby output a third and a fourth latency signal.

14. The latency control circuit as recited in claim 13, wherein the first latency signal generator includes:

a first NAND gate for receiving the first latency preliminary latency signal and an inverted latency extension signal;

a first delaying unit for inverting and delaying an output of the first NAND gate to thereby output the first latency signal;

a second NAND gate for receiving the second preliminary latency signal and the inverted latency extension signal;

a third NAND gate for receiving the first preliminary latency signal and the latency extension signal;

a fourth NAND gate for receiving outputs of the second and the third NAND gates; and a second delaying unit for delaying an output of the fourth NAND gate to thereby output the second latency signal.

15. The latency control circuit as recited in claim 14, wherein the second latency signal generator includes:

a fifth NAND gate for receiving the third latency preliminary latency signal and the inverted latency extension signal;

a third delaying unit for inverting and delaying an output of the fifth NAND gate to thereby output the third latency signal;

a sixth NAND gate for receiving the fourth preliminary latency signal and the inverted latency extension signal;

a seventh NAND gate for receiving the third preliminary latency signal and the latency extension signal;

an eighth NAND gate for receiving outputs of the sixth and the seventh NAND gates; and a fourth delaying unit for delaying an output of the eighth NAND gate to thereby output the fourth latency signal.

* * * * *